Aug. 22, 1967

J. ANDERSON 3,337,823

AUTOMATIC TUNING DEVICE HAVING MEANS FOR COMPARING THE CURRENTS IN THE INDUCTIVE AND CAPACITIVE ARMS OF A TANK CIRCUIT

Filed March 25, 1964

INVENTOR
JAMES ANDERSON

BY Nolte & Nolte
ATTORNEY

United States Patent Office 3,337,823
Patented Aug. 22, 1967

3,337,823

AUTOMATIC TUNING DEVICE HAVING MEANS FOR COMPARING THE CURRENTS IN THE INDUCTIVE AND CAPACITIVE ARMS OF A TANK CIRCUIT

James Anderson, Dallas, Tex., assignor to Continental Electronics Manufacturing Co., Dallas, Tex., a corporation of Texas Filed Mar. 25, 1964, Ser. No. 354,628
8 Claims. (Cl. 334—26)

ABSTRACT OF THE DISCLOSURE

This invention relates to an automatic tuning device having means for comparing the currents flowing in the capacitive and inductive arms of the tank circuit to be tuned and employing any unbalance current to control a motor for repositioning the components of the tank circuit.

Figure 1:
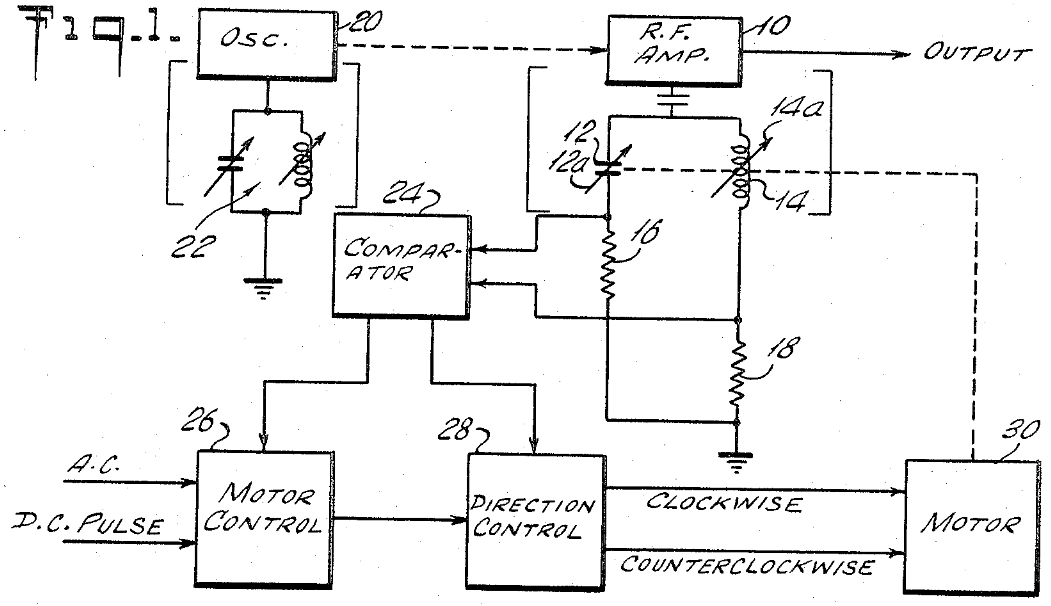

This invention relates to apparatus for automatically tuning radio frequency apparatus.

The tuning of a radio frequency transmitter normally requires a relatively complicated manual operation to properly tune the transmitter to the desired carrier frequency. After the transmitter carrier or master oscillator has been adjusted with relative ease to a desired frequency, the tuning elements of the radio frequency (RF) power amplifier must be properly tuned to the selected frequency. If time is not a material consideration, this is no hardship, but there are many situations wherein continuous or at least quasi-continuous operation of the transmitter is desired, and indeed, necessary, even though the transmitter frequency is to be changed.

The prior art has improved on such manual tuning operations through the use of a phase discriminator coupled to the branches of the resonant circuit to control the physical positioning of the variable tuning elements. However, such prior art devices are only semi-automatic since they require inductive coupling, and thus have a relatively limited range of frequencies (the "captive" range) over which they are capable of tuning the transmitter. Moreover, the use of phase discriminators is a relatively expensive and complex technique. Additionally, phase discriminators are susceptible to amplitude variations in the applied signals, and, therefore, likely to introduce additional error for this reason.

Accordingly, the main object of the present invention is to provide an improved automatic tuning device for use with electronic equipment.

A more specific object of the invention is to provide an automatic tuning device operable over an increased range of frequencies.

Another object is to provide an automatic tuning device which is insensitive to the amplitudes of the radio frequency voltages involved.

Still another object is to provide an automatic tuning device of relative simplicity and high accuracy.

In this and related arts, it is conventional for a servo or the like to position the tuning elements in response to an error voltage generated in various manners. In my application No. 345,921, filed on Feb. 19, 1964, and entitled, "A Device," a novel auto-positioning device is disclosed for use in tuning electronic apparatus wherein various drawbacks of the prior art are avoided. In this auto-positioning device, the operator selects a desired frequency by operation of a switch, which causes a fixed reference voltage to be compared with a voltage appearing across a potentiometer whose movable tap is coupled to the taps of the variable tuning elements. An error voltage is thus generated and used to control the operation of a reversible, synchronous motor under the control of an alternating voltage during a rough tune period, thereafter switching to the control of direct pulses for a fine tune adjustment of great accuracy. The use of a D.C. pulse supply permits full voltage pulses to be applied to the motor to bring the elements into their null position without the use of high gain amplifiers and their attendant complexities. The interval of no power that occurs between the pulses permits the null sensing device to center before the next pulse of power is applied to the motor. This eliminates any tendency to over-shoot and hunt.

To further increase the system accuracy, the prior art electro-mechanical relays are replaced with an optical meter which has an extremely small "dead band" and virtually no mechanical inertia.

Thus, another object of the present invention is to provide an automatic tuning device incorporating all of the benefits and advantages of my above mentioned auto-positioning device.

According to the invention, the above objects are accomplished by comparing the current flow in the inductive and capactive arms of the tank circuit to be tuned. Since the currents flowing in the two arms of a tank circuit are equal only at resonance, a comparator output is produced indicative of the extent to which the tuning elements must be varied to the new resonant frequency, and the direction in which they must be moved. A control circuit responsive to the comparator output selectively couples a conventional alternating voltage or direct pulse supply to a reversible motor which drives the variable taps of the tuning elements. When the comparator output is above a predetermined level, the alternating voltage is supplied to the motor to drive the motor at a relatively rapid rate during a "rough" tuning period. When the comparator output drops below this predetermined level, a control unit switches the motor to the direct pulse supply which then steps the motor during a "fine" tune period so that the tank circuit is tuned with great accuracy to the newly selected frequency.

Figure 2:
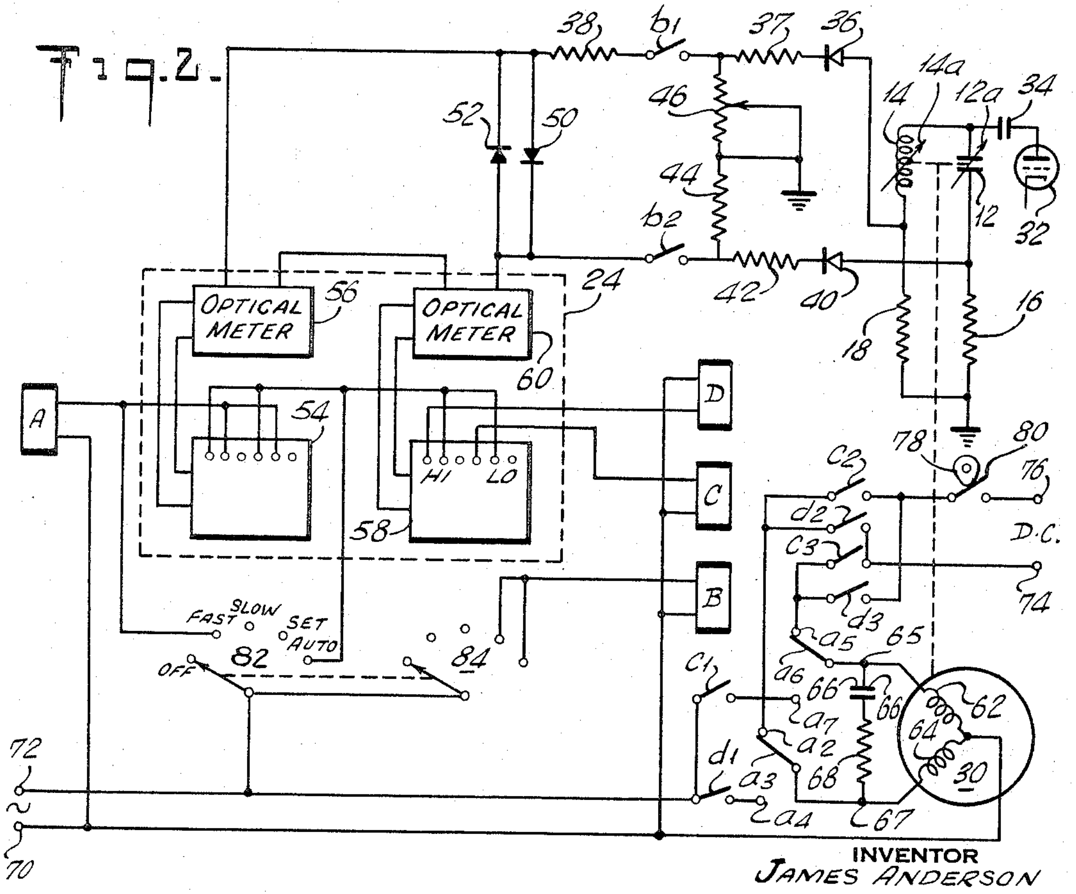

The manner in which the above and other objects of the invention are accomplished will be explained in greater detail below with reference to the following drawings, wherein:

FIGURE 1 is a schematic block diagram of an automatic tuning device according to the invention; and FIGURE 2 is a circuit diagram of the invention illustrated schematically in FIGURE 1.

In the block diagram of the invention shown in FIG. 1, an R.F. amplifier is indicated at 10 having a tank circuit including a capacitor 12 and an inductance 14. Capacitor 12 and inductance 14 include movable taps **12*a* and 14*a*, respectively, which may be adjusted to tune amplifier 10 to a desired frequency. The capacitive and inductive arms of the resonant circuit include resistors 16 and 18 in series connection with capacitor 12 and inductance 14**, respectively, for purposes to be desired below.

The transmitter includes an oscillator 20 having a variable tank circuit 22 which is adjusted in a known manner to vary the oscillator frequency and thus the transmitter carrier frequency. As indicated by dotted lines, oscillator 20 may be coupled through various buffer and amplifier stages to the input of R.F. amplifier 10.

When the frequency of oscillator 20 is changed by adjustment of tank circuit 22, it is necessary to position taps **12*a* and 14*a* to adjust capacitor 12 and inductance 14 so that the output amplifier 10 is tuned to the same frequency. In practice, the manual adjustment of these variable taps is complex and time consuming even under the control of a skilled operator. Prior art automatic systems utilizing phase detectors have limited captive frequency ranges, and, in such systems, if the oscillator frequency is changed considerably, some manual adjustment of capacitor 12 and inductance 14** is still necessary. The present invention avoids this drawback, and at the same time enables utilization of the principles embodied in the extremely accurate auto-positioning device described above.

In a resonant circuit, the current flowing in the inductive arm is equal to the current flowing in the capacitive arm at resonance. When the circuit is off resonance, the bulk of the current will flow through the capacitive arm if the applied frequency is high, and through the inductive arm if the applied frequency is low. Referring to FIG. 1, when amplifier 10 is properly tuned to the frequency of oscillator 20, the radio frequency current flowing through capacitor 12 and resistor 16 is equal to the R.F. current flowing through inductance 14 and resistor 18. The invention employs apparatus for sensing the current differential between these two arms, and adjusting the values of the tank circuit elements with extreme accuracy until the current flow in the two arms is equal, at which point the amplifier 10 is tuned to the frequency of the oscillator 20. Accordingly, a Comparator 24 has one input coupled to the junction of capacitor 12 and resistor 16, and its other input connected to the junction of inductance 14 and resistor 18, whereby the current flowing through resistors 16 and 18 may be compared and an error signal generated in accordance therewith.

For increased sensitivity, the comparator has two outputs which are coupled to a Motor Control Circuit 26 and a Direction Control Circuit 28. The two control circuits operate a motor 30 whose output shaft is manually coupled in a conventional manner to movable taps 12*a* and 14*a*, to thus vary the frequency to which R.F. amplifier 10 is tuned. A conventional A.C. supply and a D.C. pulse supply are connected to the inputs of Motor Control Circuit 26, which couples one of these input supplies to motor 30 to drive the motor in a direction controlled by Direction Control Circuit 28. When motor 30 is connected to the A.C. supply it is driven at a relatively high rate of speed, but when the supply switches to the D.C. pulses, the motor is stepped with great accuracy to the final tuned position, as will be explained hereinbelow.

The output of Comparator 24 applied to Motor Control Circuit 26 is a signal whose magnitude is related to the differential of the currents flowing in capacitor 12 and inductance 14. This signal controls the speed at which the motor 30 is driven. The comparator output applied to Direction Control Circuit 28 is a signal whose polarity is indicative of the direction in which the taps 12*a* and 14*a* must be moved to tune the amplifier 10. When the amplifier is properly tuned to the resonant frequency of oscillator 20, Motor Control Circuit 26 normally connects the D.C. pulse supply to Direction Control Circuit 28, which, however, is held open by the lack of a comparator output, to inhibit operation of motor 30.

In operation, Motor Control Circuit 26 operates when the comparator output coupled thereto exceeds a predetermined level to couple the A.C. supply to the Direction Control Circuit 28. Direction Control Circuit 28 senses the polarity of the comparator output and connects the A.C. supply to motor 30 in such a manner as to drive the motor in a clockwise or counter-clockwise direction so that inductance 14 and capacitor 12 are varied toward the new resonant frequency. When the comparator input to Motor Control Circuit 26 drops below a predetermined level, indicating that the amplifier is approaching its tuned condition, Motor Control Circuit 26 substitutes the D.C. pulse supply on its other input for the A.C. supply. The pulse supply is then coupled through Direction Control Circuit 28 in a manner also determined by the polarity of the comparator signal applied thereto, to step motor 30 in the proper direction to provide a fine tune period of great accuracy.

When the capacitor 12 and inductance 14 are tuned to the oscillator frequency applied to the input of amplifier 10, the current flow through resistor 16 is equal to the current flow through resistor 18 and no signal appears on either of the outputs of Comparator 24. Thus, Direction Control Circuit 28 is held open preventing the application of either supply voltage to motor 30, whereby amplifier 10 remains tuned to the oscillator frequency. When the oscillator frequency is again changed sufficiently so that a voltage differential appears at the input to Comparator 24, the process above-described repeats.

FIG. 2 is a circuit diagram of a specific embodiment of the invention. The tank circuit, including inductance 14 and capacitor 12, is coupled via a coupling capacitor 34 to the plate of the R.F. amplifier tube 32. This tube, as well as the oscillator 20, 22 and the associated circuitry therebetween, may be conventional and is illustrated schematically, the latter elements being omitted from the circuit diagram for purposes of clarity. The junction of inductance 14 and resistor 18 is coupled through a diode 36, current limiting resistor 37, normally open relay contact *b*1 and resistor 38 to the input of Comparator 24. The current in the capacitance arm is coupled to the other input of the comparator through diode 40, resistor 42, and a second normally open relay contact *b*2. A pair of resistors 44 and 46 are connected across the normally opened relay contacts, with the junction of the two resistors connected to ground. Two signal limiting diodes 50 and 52, oppositely poled, are connected across the input to Comparator 24. Resistor 38 and diodes 50 and 52 limit the maximum voltage applied to the comparator, i.e. the maximum voltage difference across resistors 18 and 16, so that Comparator 24 may be designed for a selected sensitivity.

Comparator 24 is a commercially available item, and, in a preferred embodiment, comprises wide range and sensitive optical meters 56 and 60, together with respective control modules 54 and 58. By way of example, each of the optical meters and control module combinations (hereinafter referred to as an optical relay) may be of the type manufactured by Assembly Products, Inc., and more fully disclosed in their published bulletin 33 of March 1963. The use of this particular comparison device is particularly desirable, since such optical apparatus has an extremely small "dead band," virtually no mechanical inertia, no contact force problems and built-in damping. The meters 56 and 60 use light directed through a system of optical fibers against a moving reflecting surface in conjunction with a light sensitive photo-cell to perform the switching function. Two separate light sources are directed to the reflecting surface which is attached to the moving coil of a D'Arsonval movement meter. Part of the moving surface is non-reflecting whereby the presence or absence of the reflected light enables the switching function. The output of each optical meter is a direct voltage indicating the existence of a predetermined difference between the quantities being measured. The polarity of the output voltage indicates which of the two quantities is greater and is externally manifested by the deflection of the meter pointer. Control modules 54 and 58, receive these signals as their respective inputs and, in response thereto, produce a relay operating voltage on their HI or LO outputs depending upon the polarity of the associated meter output, or, in other words, the direction in which the tuning elements must be adjusted.

Comparator 24 includes two separate relay devices because of the need for greater sensitivity when the applied radio frequency signal is widely displaced in frequency from the frequency to which inductance 14 and capacitor 12 are to be tuned. It is not necessary that two similar devices be used for this purpose, since the rough tuning adjustment could be performed by various other devices. For example, a variable gain amplifier could be inserted between the rectified radio frequency samples and the sensitive optical meter relay. In the illustrated embodiment, the optical relay 54, 56 is utilized for the rough tune adjustment. Relay 58, 60, considerably more sensitive than relay 54, 56, is used for the accurate final adjustment, after the current differential being measured has become too small to actuate the less sensitive or wide range relay 54, 56.

Motor 30 may be a commercially available motor sold under the trade name "Slo-Syn" by the Superior Electric Company. The motor is a conventional reversible synchronous motor including field windings 62 and 64, and may be operated from a single phase alternating source by the addition of a phase shifting network including a capacitor 66 and a resistor 68 connected across the windings 62 and 64. The common junction of windings 62 and 64 is connected to a terminal 70 of the A.C. terminals 70 and 72. The motor is driven in a clockwise or counterclockwise direction depending upon whether terminal 72 is coupled to motor terminal 65 or 67.

A pair of direct voltage supply terminals 74 and 76 provide the D.C. pulses for the motor during the fine tune adjustment period. For example, the D.C. pulses may be provided by a rotating cam 78 cooperating with a switch 80 in one of the supply lines in a conventional manner. When motor 30 is driven by the pulses on terminals 74 and 76, the two terminals must be reversed with respect to motor terminals 65 and 67 to change the direction of rotation of the motor. The manner in which the respective terminals are switched to place the motor under the control of a desired supply to drive the motor in a particular direction at a given rate is described in greater detail below.

A pair of rotary ganged switches 82 and 84 control the mode of operation of the device. As illustrated, the switches include OFF, FAST, SLOW, SET, and AUTO (automatic) switch positions. The rotary armatures of switches 82 and 84 are electrically connected together to A.C. supply terminal 72 to provide the operating potentials for the relay control circuitry of the invention.

The relay control includes four relays A, B, C and D. To facilitate explanation of the circuit operation, the relay contacts associated with each relay are indicated by the corresponding lower case letter and an adjacent numeral. Thus terminal *a2*, armature *a3* and terminal *a4* are associated with relay A, armature *a3* being transferred to terminal *a4* when relay A is operated, and returning to terminal *a3* the illustrated position, when the relay is released.

Rotary switches 82 and 84, together with the relay D which initates operation, are not shown in the schematic block diagram of FIG. 1. Relay A with its associated contacts functions as the Motor Control Circuit 26 in that it determines whether the alternating voltage or direct pulses are to be applied to motor 30. Relay A is energized by the output of the wide range optical relay 54, 56. Relays C and D are operated by the output of the sensitive optical meter 58, 60 to control the direction of rotation of the motor. As illustrated, in the quiescent condition, relay contacts *a3* and *a6* contact terminals *a2* and *a5* which connect the D.C. pulse supply to the normally open contacts of relays C and D. Thus, relay A is energized to connect motor 30 to A.C. supply terminals 70 and 72 when an output appears on the wide range control module 54 indicating that the tuning elements 12 and 14 are widely displaced from the desired resonant frequency.

In operation, rotary switches 82 and 84 are set to the AUTO position. Relay B is thus energized through the armature of switch 84, closing contacts *b1* and *b2* to connect the control circuit across the arms of the circuit to be tuned. In the specific example, when the oscillator frequency coupled to the R.F. tube 32 is changed, the resonant circuit including capacitor 12 and inductance 14 is no longer tuned to the new frequency, and the current in the inductance branch will differ from the current in the capacitive branch depending upon the direction in which the elements 12*a* and 14*a* must be adjusted to resonance. Voltages thus appear across resistors 18 and 16 which are rectified by diodes 36 and 40, and coupled to ground through respective resistors 37 and 42 and resistors 46 and 44. The comparator inputs are taken across the latter resistors through voltage limiting resistor 38, signal limiting diodes 50 and 52, and the now closed relay contacts *b1* and *b2*. Thus, the magnitude of the voltage applied to the two optical meters 56 and 60 is indicative of the extent to which the inductance and capacitor must be driven to resonance, while the polarity of that voltage indicates the direction in which the two must be driven.

If the new oscillator frequency is widely displaced from the previously tuned frequency, optical meter 56, which may be one tenth as sensitive as meter 60, actuates its control module 54 to energize relay A, causing contacts *a3* and *a6* to switch to terminals *a4* and *a7*, respectively, whereby the motor is controlled by the alternating voltage on terminals 70 and 72. At the same time, meter 60 causes its associated control module 58 to apply a control voltage to its HI or LO output terminal depending upon the direction in which the motor is to be driven. The HI and LO outputs of module 58 are connected to relays D and C, respectively, to cause operation thereof. Hence, depending upon the polarity of the input signal to Comparator 24, relay C or D is energized, driving motor 30 in one of two directions. For example assuming that relay A has been energized, if relay D is energized, contact *d1* closes applying the voltage on supply terminal 72 to motor terminal 67 through terminal *a4* and contact *a3* to drive the motor in one direction. On the other hand, if relay C had been energized, terminal 72 would be connected instead to motor terminal 65 through closed contact *c1*, terminal *a7* and contact *a6* to drive the motor in the other direction.

When the motor is energized, it drives taps 12*a* and 14*a* to change the frequency of the circuit to be tuned toward the desired resonant frequency. When the tuned circuit approaches within a predetermined distance of resonance, determined by the nature of the apparatus to be tuned, the voltage applied to Comparator 24 becomes insufficient to enable meter 56 to operate module 54, which then releases relay A. The contacts of relay A, therefore, return to their illustrated position, in which the A.C. supply terminals 70 and 72 are disconnected from the motor. From this point until resonance, as long as the sensitive meter 60 measures a difference in the current flowing through inductance 14 and capacitor 12, the D.C. pulse supply is applied to terminals 65 and 67 to continue driving the motor under the stepped control of the pulses with extreme accuracy to the final position. For example, if relay C is energized, terminal 76 is connected to motor terminal 67 through contact *c2*, terminal *a2* and contact *a3*. At the same time, supply terminal 74 is connected to motor terminal 65 through closed contact *c3*, terminal *a5* and contact *a6*. On the other hand, if relay D is energized, supply terminal 74 is connected to motor terminal 67 through contact *d2*, and supply terminal 76 is connected to motor terminal 65 through contact *d3*.

In the manner above described, the transmitter amplifier may be tuned over a much wider range of captive frequencies than hereto possible, and tuned with extreme accuracy during a fine tune period under the application of full voltage and drive power, while decreasing considerably the hunting required prior to location of the null point.

The device may be provided with manual tuning controls which need comprise no more than a pair of manual switches adapted to short circuit all of the contacts of relay D or relay C, respectively. Under these circumstances, the device has various modes of operation. For example, when switches 82 and 84 are set in the FAST position, relay A is held energized through the rotary contact of switch 82, and the operator, by depressing one of such manual switches (effectively closing the contacts of relay C or D) can then drive the motor in a desired direction as described above. In the FAST position, the circuit cannot switch to a fine tune adjustment under the control of the pulses on supply terminals 74 and 76, since these terminals are disconnected by relay armatures *a*3 and *a*6.

Similarly, when switches 82 and 84 are placed in the SLOW position, the device can only operate in response to the pulses appearing on terminals 74 and 76. The SET position of switches 82 and 84 is used when it is desired to adjust the meters in accordance with various technical requirements. Unless the armature of switch 82 is in the AUTO position, the necessary supply voltage for operation of modules 54 and 58 is not present, preventing automatic operation of the circuit.

Although a preferred embodiment of the invention has been shown and described, the invention is not so limited and should only be defined by the following claims.

What is claimed is:

1. An automatic tuning device for tuning a tank circuit having inductive and capacitive arms, comprising comparison means for comparing the magnitudes of the current flow in each of said arms, and means responsive to said comparison means for altering the frequency to which said tank circuit is tuned.

2. Automatic tuning apparatus for tuning a device including a tank circuit having capacitive and inductive arms, and movable means for altering the resonant frequency of said tank circuit, comprising means for comparing the magnitudes of the current flowing in each of said arms, a reversible motor electrically connected from the output of said comparator means and responsive to the output thereof, and means mechanically linking the output shaft of said motor with said movable means.

3. An automatic tuning device for tuning a circuit comprising a variable inductance and a variable capacitance, comprising comparator means for comparing the magnitudes of the currents flowing through said inductance and said capacitance, said comparator means having an output whose magnitude is related to the magnitude of the difference between said currents and a polarity indicative of which of said currents is the greater, a motor for adjusting said variable inductance and capacitance to alter the resonant frequency thereof, and control means connected to the output of said comparator for controlling the speed and direction of rotation of said motor in response to the magnitude and polarity of said comparator output.

4. An automatic tuning device according to claim 3, wherein said comparator means includes optical relay means.

5. An automatic tuning device according to claim 4, wherein said control means is adapted to selectively connect an alternating voltage source or a source of direct pulses to said motor depending upon the magnitude of said comparator output.

6. An automatic tuning apparatus for tuning the output amplifier of a transmitter in response to a change in carrier frequency, said amplifier including a tank circuit comprising a variable inductance and a variable capacitance and respective voltage dropping impedances connected in series therewith, comprising a comparator having inputs connected from each of said voltage dropping impedances for comparing the magnitudes of the currents flowing through said inductance and capacitance, said comparator including means for producing a first output when said currents differ by a predetermined amount, and means for producing a second output indicative of which of said currents is the greater, a reversible motor, a source of alternating voltage, a source of direct voltage pulses, motor control means connected to said first comparator output for coupling one of said voltage sources to said reversible motor, direction control means connected to the second of said outputs for connecting the voltage source coupled through said motor control means to said motor in such a manner as to selectively drive the output shaft of said motor in a clockwise or counterclockwise direction, whereby to tune said amplifier to said carrier frequency.

7. An automatic tuning device according to claim 6, wherein said comparator includes optical relay means for producing said second comparator output.

8. An automatic tuning device according to claim 6, wherein said comparator includes wide range optical relay means for producing said first comparator output, and sensitive optical relay means for producing said second comparator output.

References Cited

UNITED STATES PATENTS

| | | | |
|---|---|---|---|
| 2,489,064 | 11/1949 | Vogel | 325—177 X |
| 3,277,378 | 10/1966 | Heaton-Armstrong | 325—174 X |

HERMAN KARL SAALBACH, *Primary Examiner.*

P. L. GENSLER, *Assistant Examiner.*